(12) United States Patent
Redman-White

(10) Patent No.: US 8,400,857 B2
(45) Date of Patent: Mar. 19, 2013

(54) CIRCUIT FOR SENSING THE CONTENT OF A SEMICONDUCTOR MEMORY CELL

(75) Inventor: William Redman-White, Hampshire (GB)

(73) Assignee: NXP B.V., Eindhoven (NL)

( * ) Notice: Subject to any disclaimer, the term of this patent is extended or adjusted under 35 U.S.C. 154(b) by 144 days.

(21) Appl. No.: 13/056,372

(22) PCT Filed: Jul. 27, 2009

(86) PCT No.: PCT/IB2009/053263
§ 371 (c)(1),
(2), (4) Date: Jan. 28, 2011

(87) PCT Pub. No.: WO2010/013192
PCT Pub. Date: Feb. 4, 2010

(65) Prior Publication Data
US 2011/0128808 A1    Jun. 2, 2011

(30) Foreign Application Priority Data
Jul. 28, 2008    (EP) .................................. 08104890.2

(51) Int. Cl.
G11C 7/00    (2006.01)
G11C 7/02    (2006.01)

(52) U.S. Cl. .......................... 365/205; 365/207; 365/208

(58) Field of Classification Search .............. 365/185.21, 365/189.09, 203, 205, 207, 208, 233.1
See application file for complete search history.

(56) References Cited

U.S. PATENT DOCUMENTS

| | | | | |
|---|---|---|---|---|
| 5,317,218 A | * | 5/1994 | Liu | 365/185.21 |
| 5,410,268 A | | 4/1995 | Sharpe-Geisler | |
| 5,519,662 A | * | 5/1996 | Ishibashi et al. | 365/207 |
| 5,815,452 A | * | 9/1998 | Shen | 365/207 |
| 6,094,394 A | | 7/2000 | La Rosa | |
| 6,137,741 A | * | 10/2000 | Liu | 365/185.21 |
| 6,411,550 B1 | | 6/2002 | Nasu | |
| 6,424,571 B1 | * | 7/2002 | Pekny | 365/185.21 |
| 6,507,523 B2 | * | 1/2003 | Pekny | 365/189.09 |
| 6,707,715 B2 | * | 3/2004 | Michael et al. | 365/189.09 |
| 7,038,936 B2 | * | 5/2006 | Seevinck et al. | 365/185.21 |

(Continued)

FOREIGN PATENT DOCUMENTS

JP    2005-276310    10/2005

OTHER PUBLICATIONS

International Search Report for Application PCT/IB2009/053263 (Oct. 28, 2009).

*Primary Examiner* — Trong Phan

(57) ABSTRACT

A sensing circuit (100) for sensing the content of a memory cell (101), wherein the sensing circuit comprises a sense node (103) connectable to the memory cell (101) so that a signal indicative of the content of the memory cell (101) is providable to the sense node (103). The sensing circuit (100) further comprises a logic gate (102) having a first input, a second input and an output, wherein a reference signal (105) is providable to the first input and wherein the sense node (103) is coupled to the second input. The sensing circuit (100) further comprises a feedback loop (104) for coupling the output of the logic gate (102) to the second input of the logic gate (102) so that, during sensing the content of the memory cell (101), an electrical potential at the sense node (103) is used to make a decision but after a result is obtained, the memory and sense amplifier combination are configured so that the result is held indefinitely and so that no static current continues to flow.

13 Claims, 5 Drawing Sheets

U.S. PATENT DOCUMENTS

| | | |
|---|---|---|
| 7,075,842 B2 * | 7/2006 | Tzartzanis et al. ............ 365/205 |
| 7,212,445 B2 | 5/2007 | Cernea et al. |
| 7,362,602 B1 * | 4/2008 | Meng et al. .................. 365/207 |
| 7,391,656 B2 * | 6/2008 | Wang et al. .................... 365/205 |
| 7,408,827 B1 * | 8/2008 | Peng et al. .................... 365/205 |
| 2002/0152365 A1 | 10/2002 | Weder et al. |

* cited by examiner

CIRCUIT FOR SENSING THE CONTENT OF A SEMICONDUCTOR MEMORY CELL

FIELD OF THE INVENTION

The invention relates to a sensing circuit for sensing the content of a memory cell.

Beyond this, the invention relates to a method of sensing a content of a memory cell, in particular of a semiconductor memory cell.

Moreover, the invention relates to a program element.

Furthermore, the invention relates to a computer-readable medium.

BACKGROUND OF THE INVENTION

Sensing circuits may be used for sensing contents of memory cells. In particular, such circuits may be used for sensing a content of low power non-volatile memories.

Memory cells, in particular non-volatile memory devices, use charge storages for example on a MOS transistor gate to indicate the presence of a logic value "1" or "0". The distinction between these two states may be sensed by observing a current which passes through the memory transistor, when it is connected to a supply voltage. The magnitude of the current is determined by the charge stored on the polarised gate of the memory transistor. Over time and use, the current observed for each state may change so that the current difference between the two states gets closer together. Therefore, the content of a memory cell may be sensed by a sensing circuit, e.g. a sense amplifier.

Such a sense amplifier makes a decision of a logic value "1" or "0" when a given memory bit, i.e. a transistor with a polarized gate, is connected by means of an address selection logic, that means word lines and bit lines, etc. Since the sensing of a logical value stored in the memory cell is undertaken by observing the current when a voltage is applied, there is a measurable power drain from the supply of the sensing circuit. If the sensing circuit is not managed properly, the drain may be a constant power drain so that a difference between stored values may not be sensed.

US 2002/0152365 A1 discloses a memory device having memory cells for storing data. The memory device described is distinguished by the fact that a current switch-off device is provided, which prevents an existing current flow through the memory cell to be read in response to the identification of the memory cell content, and/or that a discharge device is provided, which partly discharges again a node in the memory cell which is to be precharged before the memory cell is read.

However, during sensing of a content of a memory cell, it may still happen that the difference between stored values may not be sensed properly.

OBJECT AND SUMMARY OF THE INVENTION

It is an object of the invention to provide a sensing system for sensing a content of a memory cell allowing a proper sensing of different values stored in the memory cell.

In order to achieve the object defined above, a sensing circuit for sensing a content of a memory cell, a method of sensing a content of a memory cell, a program element and a computer-readable medium according to the independent claims are provided.

According to an exemplary embodiment of the invention, a sensing circuit for sensing a content of a memory cell is provided, wherein the sensing circuit comprises a sense node, which is connectable to the memory cell so that a signal indicative of the content of the memory cell is providable to the sense node. The sensing circuit further comprises a logic gate having a first input, a second input and an output at which a result of a logic operation of signals provided at the inputs may be provided, wherein a reference signal is providable to the first input and wherein the sense node is coupled to the second input. The sensing circuit further comprises a feedback loop for directly or indirectly coupling the output of the logic gate to the second input of the logic gate so that, during sensing the content of the memory cell, an electrical potential or voltage at the sense node is kept at a constant value. Preferably, the feedback loop may be a digital feedback loop. The feedback may be provided so that when the sense node has been determined to be indicative of either a logic value "1" or "0", the logical state is fed back and switches the sense node configuration so that there is no current flow while the logical value is held in a static latch arrangement.

According to another exemplary embodiment of the invention, a method of sensing a content of a memory cell is provided, wherein the method comprises providing a signal indicative of the content of the memory cell to a sense node, providing a reference signal to a first input of a logic gate, coupling the sense node to a second input of the logic gate, coupling an output of the logic gate to the second input of the logic gate so that, during sensing the content of the memory cell, an electrical potential at the sense node is kept at a constant value. Preferably, the feedback loop may be a digital feedback loop. The feedback may be provided so that when the sense node has been determined to be indicative of either a logic value "1" or "0", the logical state is fed back and switches the sense node configuration so that there is no current flow while the logical value is held in a static latch arrangement.

According to still another exemplary embodiment of the invention, a program element (for instance a software routine, in source code or in executable code) is provided, which, when being executed by a processor, is adapted to control or carry out a sensing method having the above mentioned features.

According to yet another exemplary embodiment of the invention, a computer-readable medium (for instance a CD, a DVD, a USB stick, a floppy disk or a hard disk) is provided, in which a computer program is stored which, when being executed by a processor, is adapted to control or carry out a sensing method having the above mentioned features.

Sensing a content of a memory cell which may be performed according to embodiments of the invention can be realized by a computer program, that is by software, or by using one or more special electronic optimization circuits, that is in hardware, or in hybrid form, that is by means of software components and hardware components.

According to an embodiment of the invention, it may be possible to reduce or minimize the electric current flow during the sensing of the logical state of the memory cell, and further to suppress or eliminate any possibility that current can continue to flow once the decision has been made. One or more additional feedback loops may be added to the sensing circuit so that once the decision in the logic gate about the content of the memory cell has been made, the sense node and the logic gate may be configured as a latch so holding the determined data value, i.e. an electrical potential at a constant value. Further, the action of latching the sense node may be performed in such a way as to block all current from flowing. Hence the memory cell and thus the entire memory array, once read, may be left in that state without further current flow.

In the following, further exemplary embodiments of the sensing circuit will be explained. However, these embodiments also apply to the method, to the program element and to the computer-readable medium.

The feedback loop may comprise a switch. This may be a transistor, in particular a FET. Preferably, the gate of the transistor may be coupled to the output of the logic gate. The transistor therefore may be switched off and on dependent on the output signal of the logic gate. Thus, it is possible to hold the sense node at a constant electrical potential in the context of latching the state of the sense node.

The sensing circuit may further comprise a second feedback loop coupling the output of the logic gate to the connection between the memory cell and the sense node so that the logic gate is disconnectable from the memory cell. This feedback loop provides the advantage that the logic gate is prevented from having any significant short circuit current while making a decision about the content of the memory cell. The logic gate may be enabled at a time when the sense node has reached a voltage likely to give a possibility for a clear decision in the logic gate, and hence a short or minimum time for a short circuit current.

The second feedback loop may comprise a switch. This switch may be a transistor, in particular a FET. The gate of the transistor may be coupled with the output of the logic gate or more precisely may be controlled by a signal which may be derived from the signal provided at the output of the logic gate so that dependent on the output signal of the logic gate, the sense node and thus the logic gate may be disconnected from the memory cell.

The logic gate may comprise a NOR (Not-OR) gate. It may also comprise another logic gate or a combination of different other logic gates, e.g. NAND (Not-AND) gates.

The output of the logic gate may be connected to an input of a second logic gate. This second logic gate may be used for several logic functions as for example conventional logic functions.

The reference signal may be a clock signal controlling time intervals during which the content of the memory cell is sensed, and controlling time intervals during which the content of the memory cell is not sensed. The content may be sensed during a low or high signal of the clock signal. The clock signal may be supplied by a memory control unit or by a user.

The sensing circuit may be adapted as a sense amplifier for amplifying the sensed signal. Thus, the content of the memory cell is not only sensed but also amplified before outputted. Such a sense amplifier makes a decision of a logic value "1" or "0" when a given memory bit, i.e. a transistor with a polarized gate, is connected by means of an address selection logic, that means word lines and bit lines, etc. Since the sensing of a logical value stored in the memory cell is undertaken by observing the current when a voltage is applied, there is a measurable power drain from the supply of the sensing circuit. By keeping the sensing gate in a tri-state mode, or removing its power supply, the sense node is allowed to drift towards a potential that indicates either a logic value "1" or "0". If the logic gate were to be connected to the sense node all the time with no tri-state or other blocking, there would be short-circuit current through the CMOS gate at the point where the input is in the range of half the power supply voltage.

The sensing circuit may further be adapted as a cascode amplifier. For that, the sensing circuit may comprise cascode transistors. A cascode amplifier is a two-stage amplifier for example composed of a transconductance amplifier followed by a current buffer. The cascode amplifier may be constructed from two transistors, with one transistor operating as an emitter or source and the other transistor operating a base or gate. The common gate part of the cascode configuration around the memory cell is there to set the voltage on the memory cell by means of the source of the common gate transistor and its tightly controlled gate bias and to have a high impedance output at the drain where the current drawn by the memory can be compared with the current in the memory cell.

The sensing circuit may further comprise a third feedback loop coupling directly or indirectly the output of the logic gate to a connection between the sense node and a supply voltage. The sense node and the logic gate may thereby be latched and the electrical potential of the sense node may be kept at constant value referred to the positive supply voltage dependent on the output of the logic gate.

The third feedback loop may comprise a switch. This switch may be a transistor, in particular a FET. The gate of the transistor may be coupled to the output of the logic gate so that the transistor may be switched off and on dependent on the output of the logic gate.

In the following, a further exemplary embodiment of the sensing method will be explained. However, these embodiments also apply to the sensing circuit, to the program element and to the computer-readable medium.

The method may further comprise precharging the sense node before sensing the content of the memory cell. After an electric charge has been loaded on the sense node, the sensing circuit is ready for operation.

A memory cell may be a building block of computer data storage and may be manufactured in semiconductor technology. Memory cells may be arranged in large arrays and may be used as mass storage devices. Embodiments of the invention may operate with both volatile and non-volatile memory cells.

The aspects defined above and further aspects of the invention are apparent from the examples of embodiment to be described hereinafter and are explained with reference to these examples of embodiment.

BRIEF DESCRIPTION OF THE DRAWINGS

The invention will be described in more detail hereinafter with reference to examples of embodiment but to which the invention is not limited.

DESCRIPTION OF EMBODIMENTS

Figure 1:
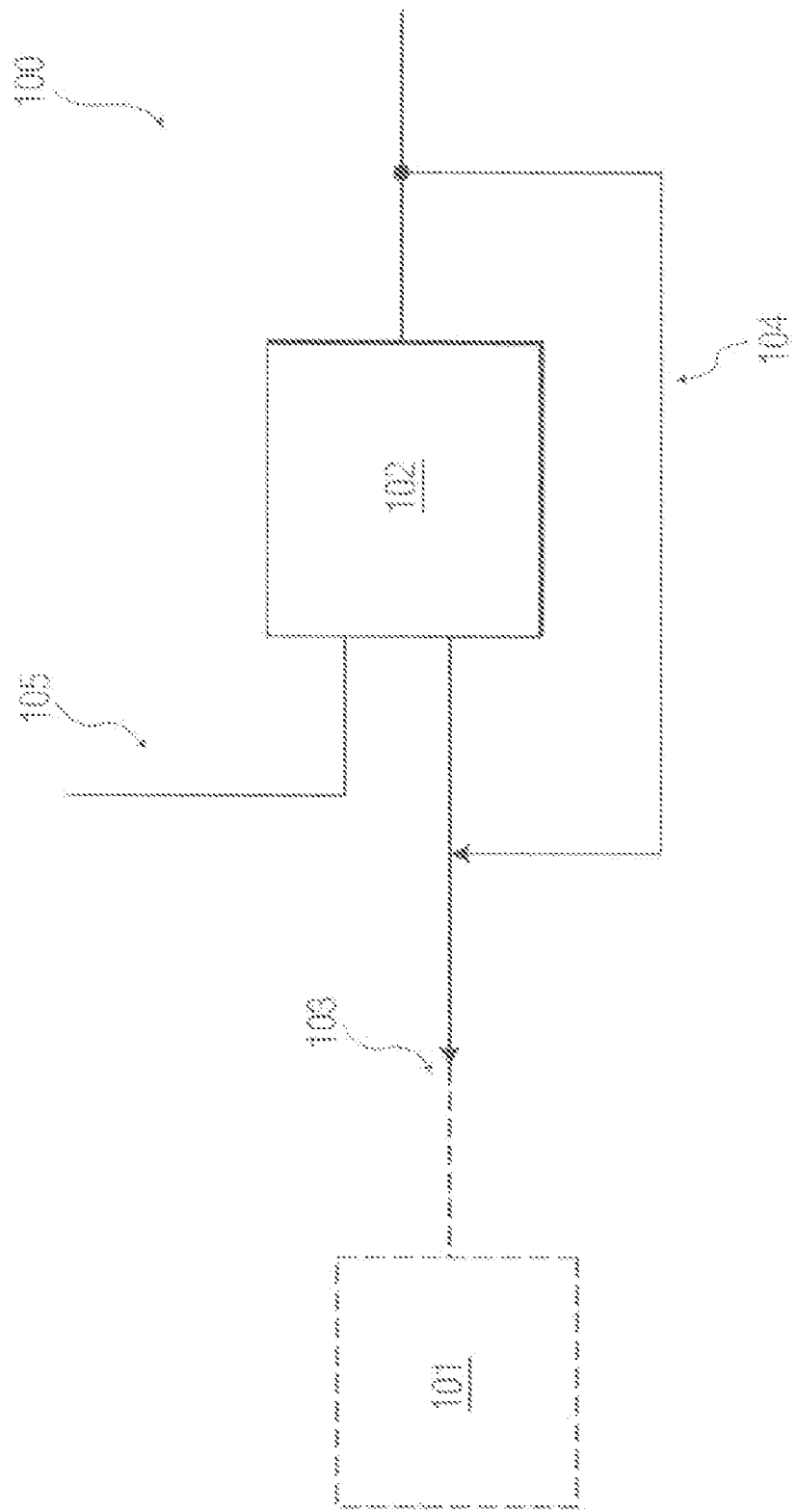
FIG. 1 illustrates a sensing circuit for sensing a content of a memory cell according to an exemplary embodiment of the invention.

The illustration in the drawing is schematically. In different drawings, similar or identical elements are provided with the same reference signs.

Figure 4:
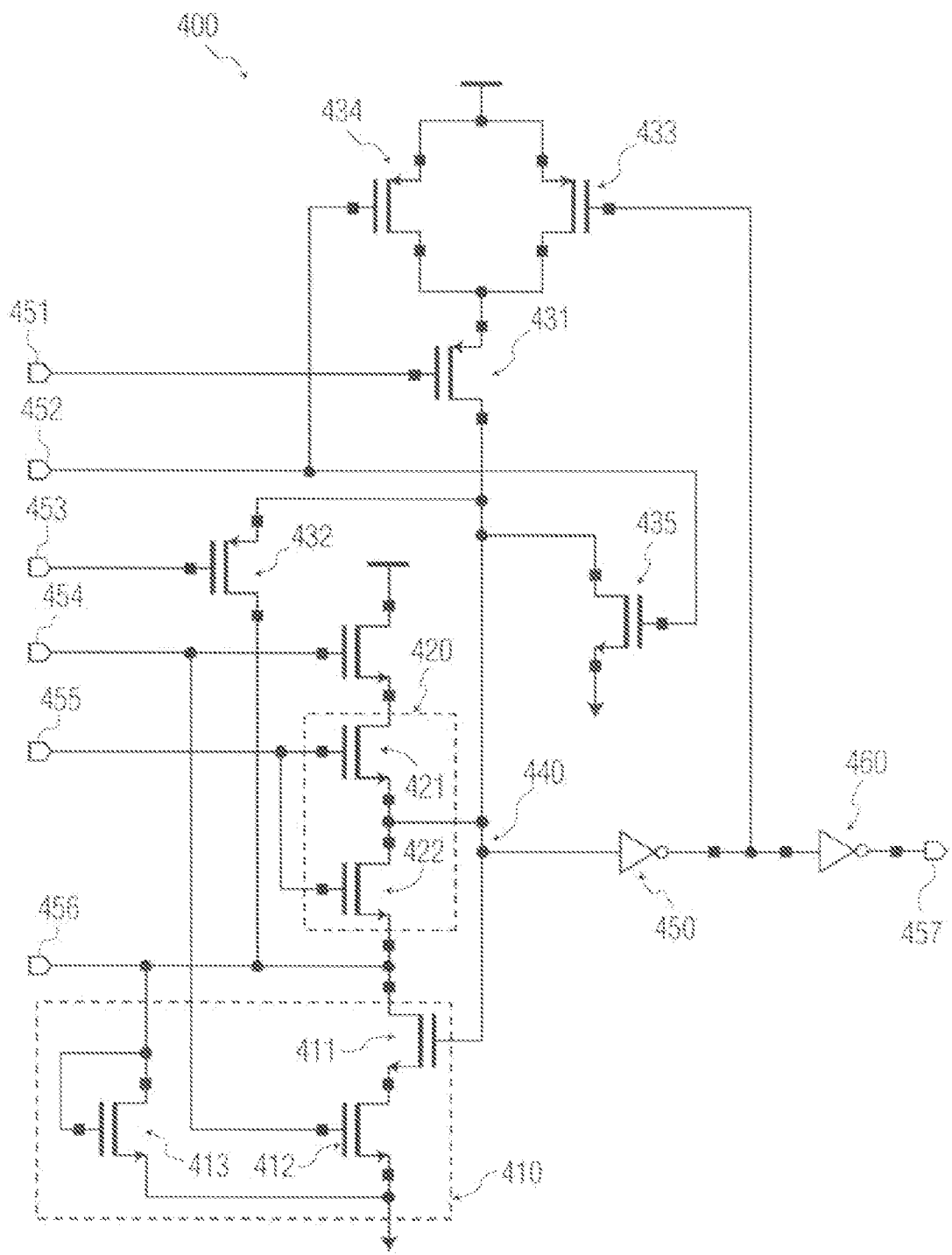
FIG. 4 illustrates a conventional sensing circuit for sensing a content of a memory cell.

FIG. 4 illustrates a conventional sensing circuit, i.e. a sense amplifier. The sensing circuit 400 comprises a memory cell 410 comprising three transistors 411, 412 and 413. The sensing circuit 400 further comprises a cascode circuit 420 comprising two transistors 421, 422. The transistors 421, 422 are coupled in series and the source of the n-channel cascode transistor 422 is coupled to the drain of the transistor 411 of the memory cell 410.

For sensing the value of the memory cell 410 the current flowing in the drain of the cascode transistor 422 is sensed. The cascode circuit 420 is biased and the bias voltage of the transistor 422 sets the drain voltage of the memory cell, and hence the current flow. This value is controlled from a biased generator common to all sense amplifiers in the memory array. With the circuit, it is possible to set the drain voltage of the memory cell 410 to a repeatable value for each data value determination.

A high impedance node 440 is precharged to the positive supply and set with a reference current source from the positive supply by several transistors 431, 432, 433 and 434. The sensing circuit comprises further an amplifier cell 450, typically an inverter. If the current flows into the memory cell 410 the high impedance node 440 or test node remains high, if the memory current is negligibly small. If the current in the memory cell 410 is larger than the reference current, the test node 440 goes low. If the test node 440 goes low, then there is a remaining current drain equal to the reference current which is present until the cell 410 is disabled in some way. This may be done by an additional transistor 435, which may be set for disabling the memory cell.

There is also some current flow through the amplifier cell 450 used to sense the voltage on the test node 440. As the inverter 450 input goes through the region near half the supply voltage, there will be a current through the inverter 450, which may be significant, and may have a significant duration, if the test node 440 voltage change is slow. If the memory cell 410 remains high, there may be a negligible current drain if the memory cell 410 is new. If the memory cell is nearer to the end of its life, there may be a small current flow although less than the reference current. The sensing circuit comprises an additional inverter 460 acting in conventional purely logical functions. Input 451 is the for the positive bias input, input 452 is for the disable input, input 453 is for the positive bias 2 input, input 454 is for the precharge input, input 455 is for the negative bias input, 456 input is for the input and output 457 is for the output.

FIG. 1 illustrates a schematic view of an embodiment of the present invention. This sensing circuit 100 comprises a logic gate 102 with two inputs and one output. The first input is coupled with a reference signal 105. This may be, for example, a clock signal supplied by a clock generation unit (not shown). The second input is coupled to a sensing node 103 which is connected to a memory cell 101. The logic gate 102 compares a logic binary value indicative of information stored in the memory cell 101 with the reference signal 105 and generates dependent on these both signals an output in accordance with the logic function provided by the logic gate 102. The sensing circuit 100 further comprises a feedback loop 104, which couples the output of the logic gate 102 with the second input. This feedback loop 104 may be coupled to a negative supply voltage and comprises a switch, for example a transistor, in particular a FET. With the feedback loop 104 it is possible to keep the electrical potential at the sense node 103 at a constant value during the sensing of the content of the memory cell 101. Preferably, the feedback loop 104 may be a digital feedback loop. The feedback may be provided so that when the sense node 103 has been determined to be indicative of either a logic value "1" or "0", the logical state is fed back and switches the sense node configuration so that there is no current flow while the logical value is held in a static latch arrangement.

Figure 2:
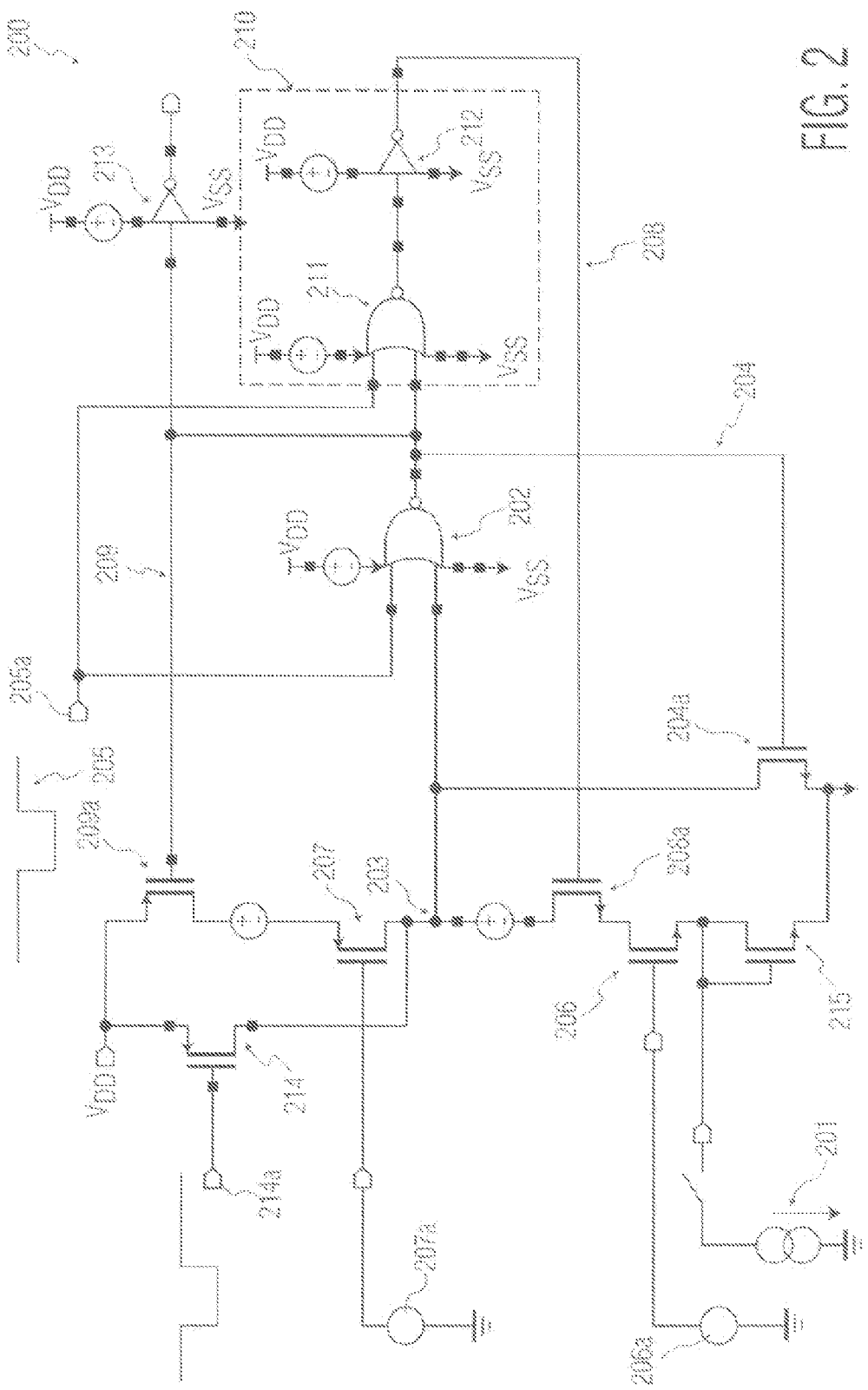
FIG. 2 illustrates a sensing circuit for sensing a content of a memory cell according to another exemplary embodiment of the invention.

FIG. 2 illustrates an embodiment of a sensing circuit 200 according to the present invention. This sensing circuit comprises a memory cell which is not shown in the figure, the memory cell being modelled by a current source 201.

The circuit 200 further comprises a logic gate 202 with two inputs and an output. The logic gate 202 is connected by the first input with a reference signal 205 on input 205a, which is a clock signal. The high value of the clock signal is equivalent to the positive supply voltage VDD and the low value of the clock signal is equivalent to the negative supply voltage VSS. The second input is connected to a sensing node 203. The output of the logic gate 202 is connected by a feedback loop 204 with the connection between the sensing node 203 and the second input of the logic gate 202. The logic gate 202 is a NOR gate, which may be also realized by different logic gates, for example NAND gates.

The sensing circuit further comprises a cascode circuit comprising two transistors 206, 207 which are coupled in series with the sense node. The sense node is precharged by a precharge clock signal on input 214a which is fed to the sensing node by a transistor 214. The precharge clock signal switches the transistor 214, so that the sensing node 203 is precharged to the positive supply voltage VDD.

The sensing circuit further comprises a transistor 215 whose gate is connected to the memory cell and whose drain is connected to the source of the transistor 206. The output of the logic gate 202 is connected to a further logic block 210 comprising a second logic gate 211 and an inverter 212. The logic block 210 acts in conventional purely logical functions. For the same purpose, the output of the logic gate 202 is further connected to an inverter 213, whose output is the output signal.

The feedback loop 204 comprises a transistor 204a which is coupled with drain to the connection between the sense node 203 and the logic gate 202 and with the source to the negative supply voltage. The output of the logic gate 202 is coupled with the gate of the transistor 204a.

The output of the logic block 210 is coupled with a feedback loop 208 to the connection between the sense node 203 and the transistor 206. The feedback loop 208 comprises a transistor 208a whose gate is coupled to the output of the logic block 210. The transistor 208a functions as a switch so that the connection between the sense node and the transistor 206 and the memory cell, respectively, may be closed or open.

The output of the logic gate 202 is further coupled with a feedback loop 209 with the connection between the transistor 207 or the sense node 203, respectively, and the positive supply voltage VDD. The feedback loop 209 comprises a transistor 209a, whose gate is coupled to the output of the logic gate 202. The transistor 209a functions as a switch so that dependent on the output of the logic gate 202 the connection between the transistor 207 or the sense node 203, respectively and the positive supply voltage VDD may be closed or open.

With the first feedback loop 204, the sense node 203 and the logic gate 202 are configured as a latch so that once a decision has been made in the memory cell, the determined data value is held. The transistor 204a may couple the sensing node 203 with the negative supply voltage dependent on the output of the logic gate 202.

With the feedback loops 204 and 209, the sense node 203 and the logic gate 202 are configured as a latch. The action of latching the sense node 203 is performed in such a way, that all current is blocked from a flowing. Hence the memory cell and thus the entire memory array once read can be left in that state without further current flow.

Figure 3A:
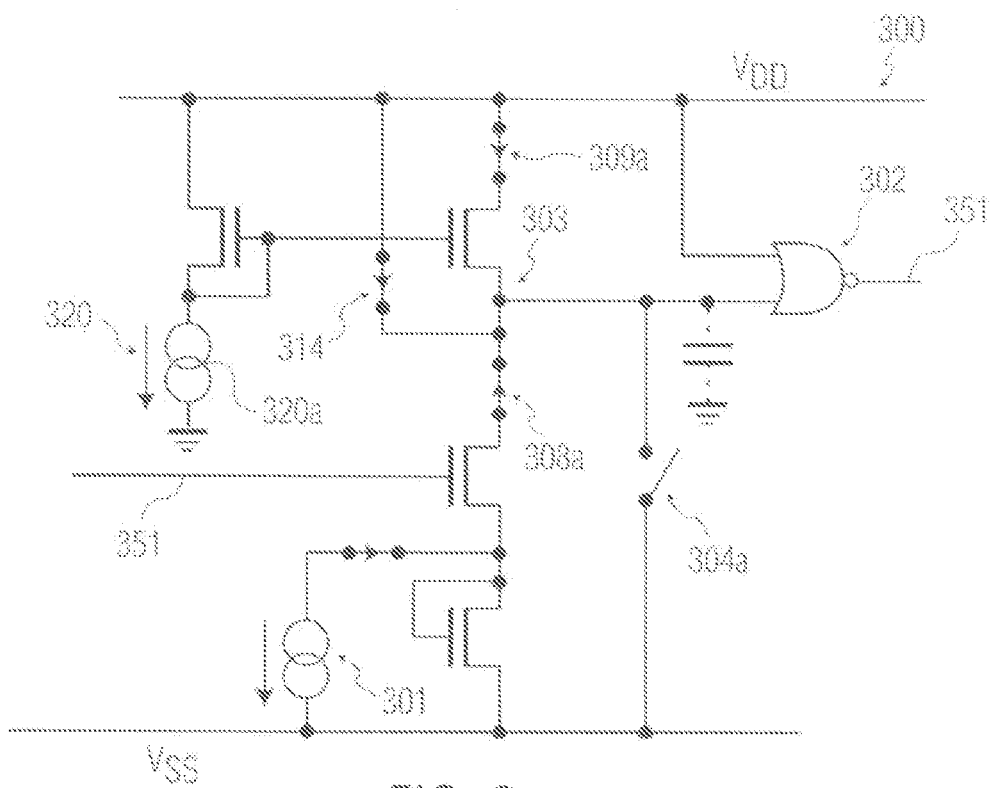
FIG. 3a illustrates an equivalent circuit in a first step of sensing a content of a memory cell according to an exemplary embodiment of the invention.

With the feedback loop 208, the sense node may be disconnected from the memory cell. Thus the logic gate 202 is prevented from having any significant short circuit current while making the decision about the value of the memory cell. The logic gate 202 is enabled at a time when the sense node has reached a voltage to give a clear possibility of determination in the logic gate 202, and hence a minimum time for a short circuit current. In FIG. 3a, an equivalent circuit of a simplified sensing circuit according to the present invention is shown. The sensing circuit comprises the sense node 303, which is coupled to the logic gate 302 and to the memory cell 301 through the n-channel transistor 308. The current 320 is a reference current value from current source 320a used to be compared with the current flowing in the memory cell when it is interrogated. The memory is read by allowing a current to pass through it. The value of the current depends on the stored value of charge and hence the effective threshold of the memory transistor. To establish a 1 or 0 state, this current is compared with a reference current 320. If the memory current is greater than the current 320, the sense node 303 is discharged to a low state. If the memory cell current is smaller than the current 320, the sense node 303 remains high, after being precharged. The logic gate 302 senses this result after waiting for a decisive result to emerge. The current 320, being 50% of the nominal "1" current, is set by means of a current mirror. In reality, a bias voltage which sets this current is common to all of the sense amplifiers and so is a low overhead. It is also possible to switch off the reference circuit for the bias voltage, i.e. for the transistors 206, 207 the bias voltage is supplied by voltage sources 206a and 207a, respectively, so that there is essentially no current drain when there is no activity in the memory.

In a first step, the two clock signals are active low one after the other. The clock signal 214 goes low for a short period while the clock signal 205 is high. This precharges the sense node 303 to near the positive supply voltage VDD, but the NOR gate 302 used as logic gate remains inhibited, so that no current can flow. The switch 304a in the first feedback loop 204 remains open, the switches 308a, 309a, in the second 208 and third feedback loop 309 remain closed. NOR gate 302 output line 351 is coupled to the gate of transistor 208a (see FIG. 2).

Figure 3B:
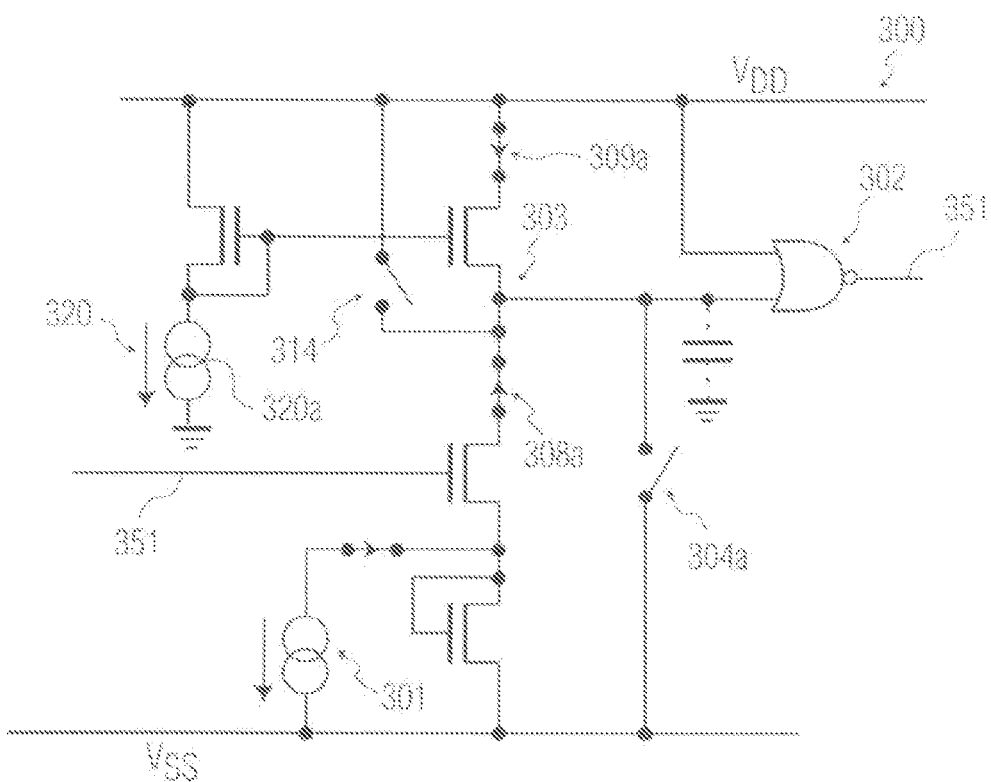
FIG. 3b illustrates an equivalent circuit in a second step of sensing a content of a memory cell according to an exemplary embodiment of the invention.

In a second step in FIG. 3b, the precharge is turned off, i.e. the switch 314 is open, and the sense node moves either high or low depending on the strength of the current from the memory cell. A short delay is left to allow the sense node 303 to get to near the positive supply voltage VDD or near the negative supply voltage VSS so that when the logic gate 302 is enabled, the decision will be swift. Further, there is no significant short circuit current due to the sense node 303 moving slowly through the mid supply voltage range as the logic gate is disabled at that time. The electrical potential of the sense node 303 is near the positive supply voltage if the sensed value of the memory cell is "0" and is near the negative supply voltage if the sensed value is "1".

Figure 3C:
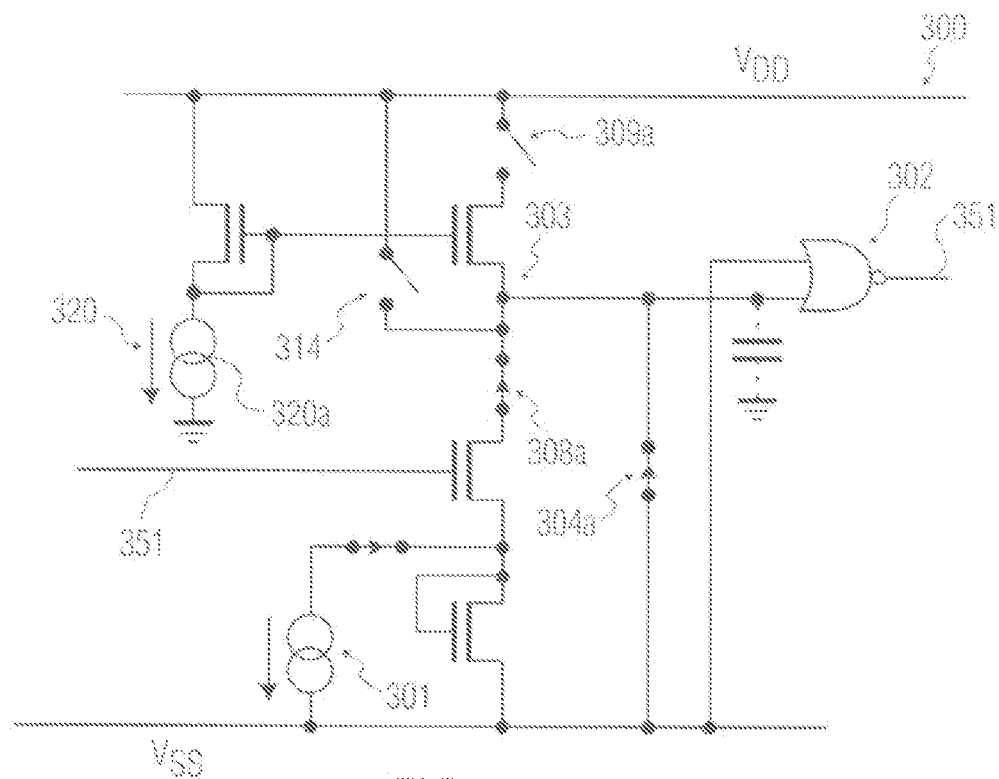
FIG. 3c illustrates an equivalent circuit in a third step of sensing a content of a memory cell according to an exemplary embodiment of the invention.

A further step is shown in FIG. 3c. When the sense node 303 has had enough time to move to a valid low state or remains high, the reference or clock signal 205 goes low and releases the logic gate 302. The first input of the logic gate 302 is therefore coupled with the negative supply voltage VSS. The logic gate 302 may now make a swift decision such that there is minimal short-circuit current through the logic gate. At the end of this phase, switches driven by the output of the logic gate 302 latch the state of the sense node 302 so that even if the memory cell 201 is disconnected from the sensing circuit, the state is held.

Figure 3D:
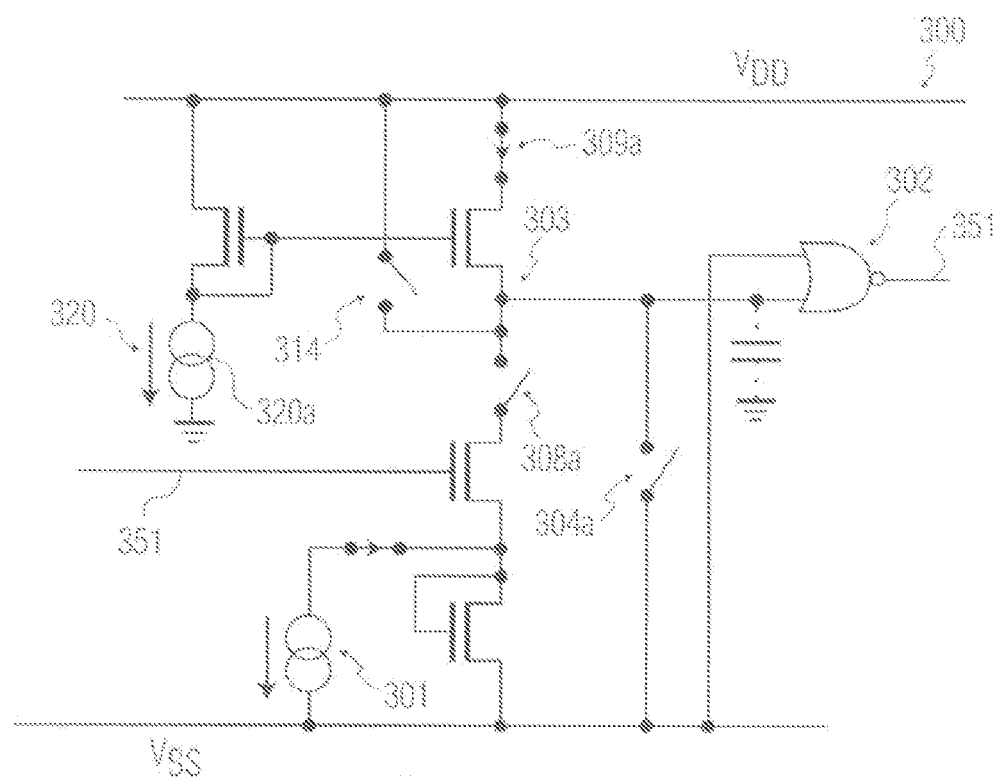
FIG. 3d illustrates an equivalent circuit in a third step of sensing a content of a memory cell according to an exemplary embodiment of the invention.

In this case, the value of the memory cell is a "1". Therefore, the switches 304a and 308a are closed and pull the sense node 303 near the negative supply voltage VSS. The switch 309a is open.

in FIG. 3d, the value of the memory cell is a "0". Therefore, the switches 304a and 308a are open. The switch 309a is closed and the sense node 303 therefore remains close to the positive supply voltage VDD.

While the memory cell 301 is connected to the sensing circuit, the feedback switches also inhibit unwanted current flow through the memory cell. This latter case could occur if the memory cell is in a "0" state, but is towards the end of its working life, when it is possible that there will be a small current. Taken over many amplifiers in parallel, this could be a significant current drain.

It should be noted that the term "comprising" does not exclude other elements or features and the "a" or "an" does not exclude a plurality. Also elements described in association with different embodiments may be combined.

It should also be noted that reference signs in the claims shall not be construed as limiting the scope of the claims.

The invention claimed is:

1. A sensing circuit for sensing a content of a memory cell, the sensing circuit comprising a sense node connectable to the memory cell so that a signal indicative of the content of the memory cell is made available at the sense node, wherein the sense node is between first and second cascade transistors arranged in series, and the series arrangement of cascade transistors connects to the memory cell,
    characterised in that the circuit comprises:
    a logic gate having a first input, a second input and an output, wherein a reference signal is provided to the first input, wherein the sense node is coupled to the second input,
    a first feedback loop for coupling the output of the logic gate to the second input of the logic gate so that; during sensing the content of the memory cell, an electrical potential at the sense node is kept at a constant value derived from the output voltage of the logic gate and
    a switch for controlling the connection between the sense node and the memory cell, the switch being in series with the first and second cascade transistors; and
    a second feedback loop providing a signal which depends on a signal provided at the output of the logic gate for controlling the switch so that the logic gate is disconnectable from the memory cell.

2. The sensing circuit according to claim 1, wherein the first feedback loop comprises a switch switchable by a signal provided at the output of the logic gate.

3. The sensing circuit according to claim 1, wherein the logic gate comprises a NOR gate.

4. The sensing circuit according to claim 1, comprising a second logic gate, wherein the output of the logic gate is connected to an input of the second logic gate.

5. The sensing circuit according to claim 1, wherein the reference signal is a clock signal controlling time intervals during which the content of the memory cell is sensed.

6. The sensing circuit according to claim 1, adapted as a sensing amplifier for amplifying the sensed signal.

7. The sensing circuit according to claim 1, adapted as a cascode amplifier.

8. The sensing circuit according to claim 1, further comprising a third feedback loop coupling the output of the logic gate to a connection between the sense node and a supply voltage.

9. The sensing circuit according to claim 8, wherein the third feedback loop comprises a switch switchable by the signal provided at the output of the logic gate.

10. A method of sensing a content of a memory cell, the method comprising
providing a signal indicative of the content of the memory cell to a sense node, wherein the sense node is between first and second cascade transistors arranged in series, and the series arrangement of cascade transistors connects to the memory cell;
characterised in that the method comprises:
providing a reference signal to a first input of a logic gate;
coupling the sense node to a second input of the logic gate;
using a first feedback loop, coupling an output of the logic gate to the second input of the logic gate so that, during sensing the content of the memory cell, an electrical potential at the sense node is kept at a constant value derived from the output voltage of the logic gate;
controlling the connection between the sense node and the memory cell using a second feedback loop providing a signal which depends on a signal provided at the output of the logic gate for controlling the connection so that the logic gate is disconnectable from the memory cell.

11. The method according to claim 10, further comprising electrically precharging the sense node before sensing the content of the memory cell.

12. A non-transitory computer-readable medium, in which a computer program of sensing a content of a memory cell is stored, which computer program, when being executed by a processor, is adapted to carry out or control a method according to claim 10.

13. A program element of sensing a content of a memory cell, which program element, when being executed by a processor, is adapted to carry out or control a method according to claim 10.

* * * * *